(12) United States Patent
Ehresmann et al.

(10) Patent No.: US 6,882,145 B2
(45) Date of Patent: Apr. 19, 2005

(54) WHEATSTONE BRIDGE CONTAINING BRIDGE ELEMENTS, CONSISTING OF A SPIN-VALVE SYSTEM AND A METHOD FOR PRODUCING THE SAME

(75) Inventors: Arno Ehresmann, Zweibruecken (DE); Wolfgang-Dietrich Engel, Trier (DE); Juergen Fassbender, Hochspeyer (DE); Burkard Hillebrands, Kaiserslautern (DE); Roland Mattheis, Jena (DE); Tim Mewes, Zweibruecken (DE)

(73) Assignee: Institut fuer Physikalische Hochtechnologie e.V., Jena (DE)

( * ) Notice: Subject to any disclaimer, the term of this patent is extended or adjusted under 35 U.S.C. 154(b) by 215 days.

(21) Appl. No.: 10/297,644

(22) PCT Filed: Jun. 7, 2001

(86) PCT No.: PCT/EP01/06486
§ 371 (c)(1), (2), (4) Date: Dec. 9, 2002

(87) PCT Pub. No.: WO01/94963
PCT Pub. Date: Dec. 13, 2001

(65) Prior Publication Data
US 2004/0023064 A1 Feb. 5, 2004

(30) Foreign Application Priority Data
Jun. 9, 2000 (DE) .......................................... 100 28 640

(51) Int. Cl.⁷ .......................... G01R 33/09; H01F 10/00
(52) U.S. Cl. ................... 324/252; 324/207.21; 428/598
(58) Field of Search ............................ 324/207.21, 244, 324/251, 252; 428/131–132, 547, 598; 338/32 R

(56) References Cited
U.S. PATENT DOCUMENTS 5,561,368 A * 10/1996 Dovek et al. ............... 324/252
5,904,996 A    5/1999 Van Der Zaag et al.

(Continued)

FOREIGN PATENT DOCUMENTS

DE   43 01 704   7/1994
DE   43 17 512   12/1994

(Continued)

OTHER PUBLICATIONS

Apr. 22, 1991 Oscillatory Magnetic Exchange Coupling through Thin Copper Layers S.S.P. Parkin, R. Bhadra, and K.P. Roche The American Physical Society/Physical Review Letters vol. 66, No. 16 2152–2155.

(Continued)

Primary Examiner—Bot LeDynh
(74) Attorney, Agent, or Firm—Jordan and Hamburg LLP

(57) ABSTRACT

The invention relates to a Wheatstone bridge containing bridge elements that are connected in a conventional manner and consisting of a spin-valve system, in addition to a method for producing the same. The aim of the invention is to produce a Wheatstone bridge, in which respective half-bridges lying adjacent to one another have a respective non-parallel bias magnetisation direction. To achieve this, the respective bridge elements that are not adjacent (1, 3 or 2, 4) are provided with a doping of implantable ions in quantities of between $1.10^{12}$ and $5.10^{16}$ atoms/cm2 beneath the pinned ferromagnetic layer of a GMR- or TMR-spin-valve layer system. During the bombardment of selected bridge areas (1, 3) or surface areas, which are not provided with a covering (5), with a low dose of low-energy ions, whose strengths are sufficiently great to enable the is ions to penetrate the pinned ferromagnetic layer, all surface areas or bridge elements (1, 2, 3, 4) are exposed to a homogeneous, targeted magnetic field of sufficient strength.

7 Claims, 3 Drawing Sheets

U.S. PATENT DOCUMENTS

Figure 1C:
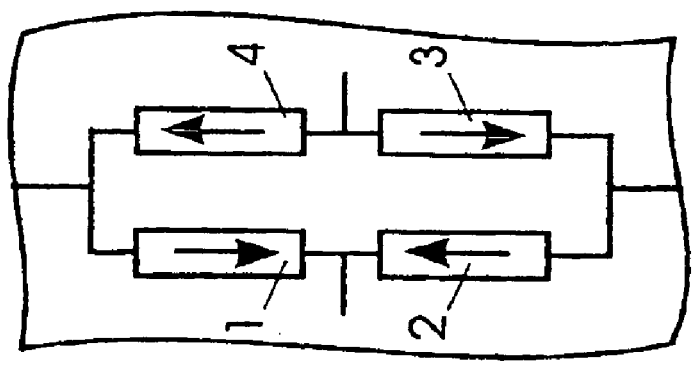

| | | | |
|---|---|---|---|
| 6,070,333 | A | 6/2000 | Hufgard et al. |
| 6,384,600 | B1 * | 5/2002 | Coehoorn .................... 324/252 |
| 6,465,053 | B1 * | 10/2002 | Lenssen et al. ............. 427/548 |
| 6,501,678 | B1 * | 12/2002 | Lenssen et al. ............. 365/173 |

FOREIGN PATENT DOCUMENTS

| | | |
|---|---|---|
| DE | 195 32 674 | 11/1996 |
| DE | 196 49 265 | 6/1998 |
| DE | 197 43 335 | 11/1998 |
| DE | 198 30 343 | 4/2000 |
| EP | 0 710 850 | 5/1996 |

OTHER PUBLICATIONS

Oct. 4, 1993 Giant Negative Magnetoresistance in Perovskitelike $La_{2/3}Ba_{1/3}MnO_x$ Ferromagnetic Films R. von Helmolt, J. Wecker, B. Holzapfel, L. Schultz, and K. Samwer The American Physical Society/Physical Review Letters vol. 71, No. 14 2331–2338.

* cited by examiner

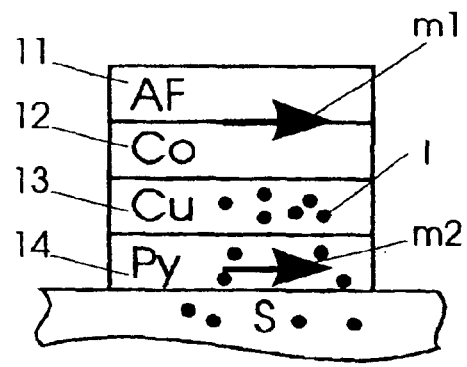
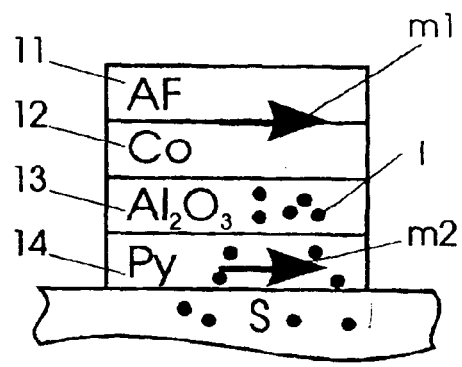
Fig. 3                    Fig. 4
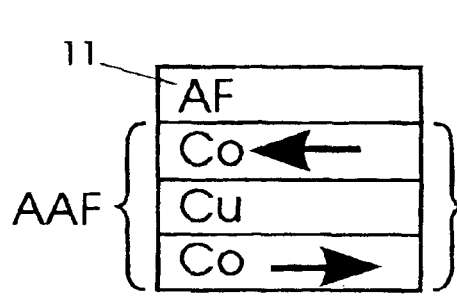
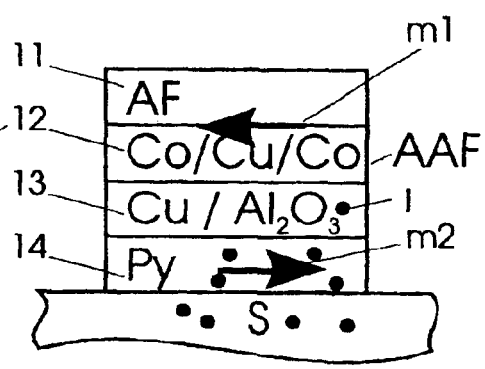
Fig. 5                    Fig. 6

WHEATSTONE BRIDGE CONTAINING BRIDGE ELEMENTS, CONSISTING OF A SPIN-VALVE SYSTEM AND A METHOD FOR PRODUCING THE SAME

BACKGROUND OF THE INVENTION

The invention relates to a Wheatstone bridge comprising conventionally interconnected bridge elements, consisting of a spin-valve system, as well as a method for producing the same.

Wheatstone bridges of this kind are preferably used as sensors for measuring small magnetic fields and as non-contactingly measuring angle sensors.

According to the prior art magneto-resistive strip conductors are used to measure magnetic fields with respect to magnitude and direction, whereby these strip conductors are anisotropic as to their magneto-resistive properties and, inter alia, interconnected in a Wheatstone bridge manner (refer to, for example, DD 256 628, DE 43 17 512 A1). The magneto-resistive strip conductors, which are employed thereby, exhibit anisotropic resistance chances with respect to an external magnetic field, which changes being a desirable property when the intended application, for example, is as a selsyn. However, such strip conductors, for example, on the basis of permalloy only show maximal resistance chances of about 2–3%, so that a comparatively high expenditure as to electronics and manufacture has to be invested.

Furthermore, materials and structures, respectively, have become known which include a so-called giant magneto-resistance (refer to, for example, S. P. P. Parkin et al., Oscillatory magnetic exchange coupling through thin copper layers, Phys. Rev. Lett., Vol. 66, pp. 2152, 1991 and R. von Helmolt et al., Giant Negative Magnetoresistance in Perovskite like $La_{2/3}Ba_{1/3}MnO_x$. Ferromagnetic Films, Phys. Rev. Lett., Vol. 71, No. 14, pp. 2331, 1993). This class of materials and structures, respectively, show magneto-resistive resistance effects, which surpass the generally used magneto-resistive materials by one to several order/s of size. The disadvantage of these materials for the intended applications consists in that they do not exhibit any anisotropic resistance effect.

Magneto-resistive sensors are realized in known manner in the form of Wheatstone bridges in order to minimize the influence by ambience on the measuring signal, such as changes in temperature, or to entirely suppress these influences. It is, however, a condition for the setup of such Wheatstone bridges that adjacent bridge branches of a half bridge will, with respect to a magneto-resistive resistance change, oppositely behave under the influence of an external magnetic field. When employing anisotropic magnetic materials such as permalloy ($Ni_{81}Fe_{19}$) which is used in typical MR-sensors, this can be realized in a comparatively simple manner in that by orienting two magneto-resistive strip conductors at right angles to each other within a half bridge or by using Barber poles, the direction of the current flowing in the magneto-resistive bridge branches is differently impressed. In the case of isotropic resistance systems such as, for example, systems with a Giant Magneto-Resistive effect, the previously used approaches do not deliver any satisfactory solution. In DE 195 32 674 C1, for example, there is shown with respect to rotation angle sensors a possible approach for anti-ferromagnetic coupled multilayer systems or for layer systems with a very great magneto-resistive resistance effect. Therein a change of magnetic fields affecting adjacent bridge branches is achieved by a conveniently formed geometry of soft-magnetic antenna geometries operating as magnetic collectors. Though this approach creates the desired effect, it includes additional structures and complicated structuring processes and it is only suited for rotation angle measurements.

Furthermore, there are layer systems known with a so-called spin-valve effect which are preferably used for detecting small fields, but also for angle detection (refer to, for example, DE 43 01 704 A1). These layer systems have in common that they consist of magnetic single layers in which, in an ideal case, one sensor layer is magnetically slightly rotatable and a bias layer is magnetically immobile. Up to now these layers can only operate as single magneto-resistive strip sensors. Though comparatively high signals are obtainable with such sensors, the measuring signals are affected by all further interference sources, such as temperature changes.

A solution for avoiding such problems is described in DE 196 49 265 A1, in which a GMR-sensor with a Wheatstone bridge is described, in which spin-valve systems are used for the individual bridge elements. This solution, however, requires a comparatively complicated layout for the Wheatstone bridges arranged on comparatively large chip surface areas (1 . . . 4 mm2). Due to this strictly required layout, a further miniaturization is not possible with this solution.

The layer setup of a spin-valve system can be designed as a GMR-layer system (under use of Giant Magneto-Resistive materials) or as a TMR-layer system (tunnel layer system). Thereby the layer system is comprised of at least one anti-ferromagnetic layer, one ferromagnetic layer pinned through the anti-ferromagnetic layer via a so-called exchange bias, whereby the ferromagnetic layer itself is a component of a so-called artificial anti-ferromagnet (AAF), at least one flux conducting layer and, arranged between these ferromagnetic layers, one conductive layer for the GMR-layer systems or for the oxidic layer of the tunnel arrangement. Thereby a magneto-resistive sensor system of at least two sensor elements can be formed by this layer setup. When used in applications, these sensor elements are typically assembled to Wheatstone bridges.

The general setup of magneto-resistive sensors, their mode of operation and their applications can be read from "Sensors—A comprehensive Survey" (editor: W. Göpel et al.), VCH publishing company Weinheim, Vol.5: Magnetic Sensors (editor: R. Boll et al.), 1989, Chapter 9: Magneto-resistive Sensors, p. 341 to 378. The represented sensors show an anisotropic magneto-resistive effect. Furthermore, it can be learned from the reference how to form sensor bridges which, for example, can be used for manufacturing 360° angle detectors. Such bridges can also be setup with sensors which are in accordance with the layer setup mentioned hereinbefore. Also here it is necessary that two sensors out of the four, which make up the bridge, are oppositely oriented to the other two with respect to the bias layer magnetization in order to obtain respective signals across the entire angular range. This is also necessary with sensors operating on the basis of a magnetic tunnel effect or with spin-valve transistors.

The setting of the bias magnetization direction (BMD) is generally carried out by applying a homogeneous magnetic field in the course of depositing a magnetic layer system onto a 3–6" Si-wafer. This results in all over the same BMD. The Patent DE 198 30 343 C1 discloses, how an anti-parallel orientation of the BMD can be achieved by a suitable selection of the layers, just as in the case where combinations of anti-ferromagnetic layers as well as layer systems which are designed as artificial anti-ferromagnets are utilized. According to this reference, this has been achieved in that, in order to enable a local anti-parallel orientation of the magnetization of the bias layers after manufacturing the AAF-system, the symmetry of the AAF-system is locally affected in such a manner that the affected and non-affected ranges of the layer setup exhibit a different behavior in a homogeneous magnetic field. Consequently, this proposal abandons an identical layer setup for all the sensor elements and for all ranges, respectively, which are intended to form sensor elements. This generally creates parasitic asymmetries with respect to resistance and, above all, to the temperature coefficient of the resistance which harmfully affects the operation behavior.

A second possibility consists in setting up the Wheatstone bridge in hybrid form in such a manner that the bridge branches consist of elements being geometrically rotated by 180° in order to achieve an anti-parallel positioning of the BMD. The first mentioned method requires suitable additional layers within the AAF having suitable properties. The last mentioned method means a considerable additional expenditure in the manufacture of Wheatstone bridges, namely an additional assembly expenditure as well as an additional expenditure for the wiring, which involves apart from higher cost, a deterioration of the reliability.

SUMMARY OF THE INVENTION

It is an object of the present invention to provide a Wheatstone bridge comprising bridge elements, consisting of a spin-valve system, as well as a method for producing the same. This invention under keeping to an initially uniform layer setup and to a uniform bias magnetization (BMD) provides a Wheatstone bridge in which respective adjacently arranged half bridges exhibit respective anti-parallel BMD, whereby a miniaturization of the Wheatstone bridge shall not be limited by any complicated circuit layout.

The object is realized by the features of the first and the third claim. Advantageous embodiments are covered by the respective dependent claims.

DETAILED DESCRIPTION OF THE INVENTION

Figure 1B:
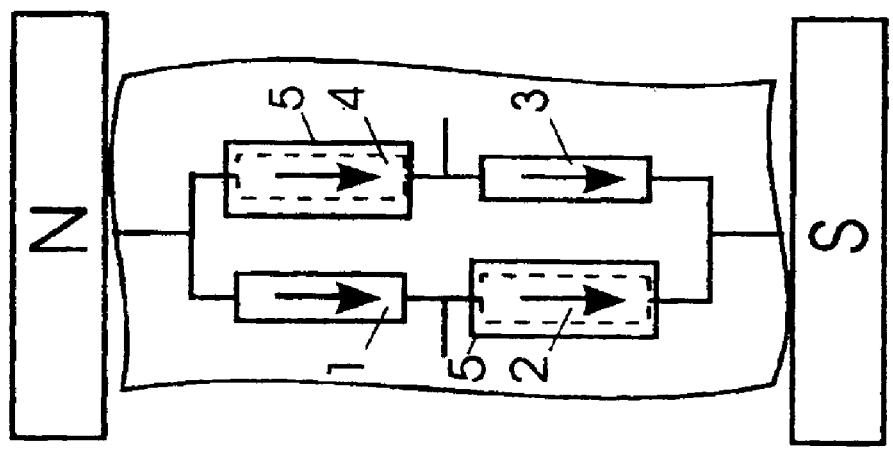
Figure 1A:
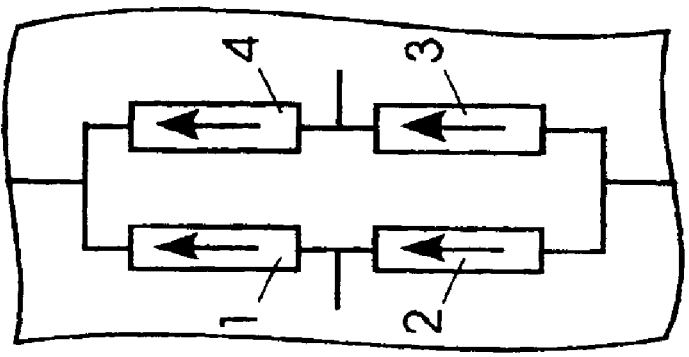
Figure 2C:
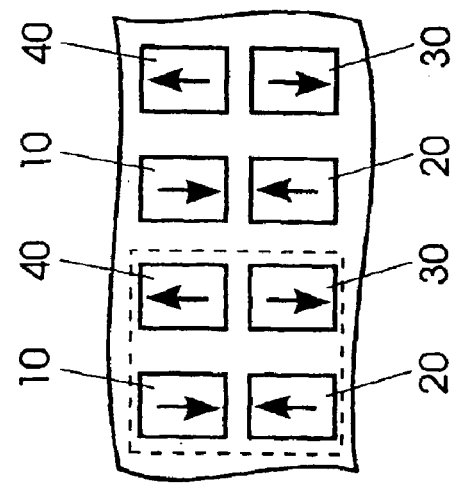
Figure 2B:
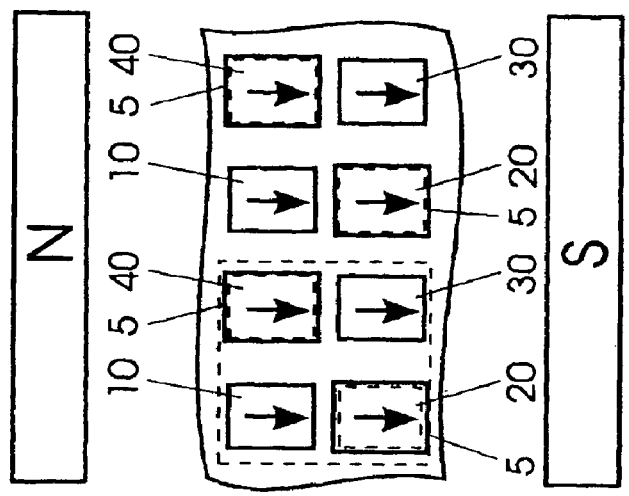
Figure 2A:
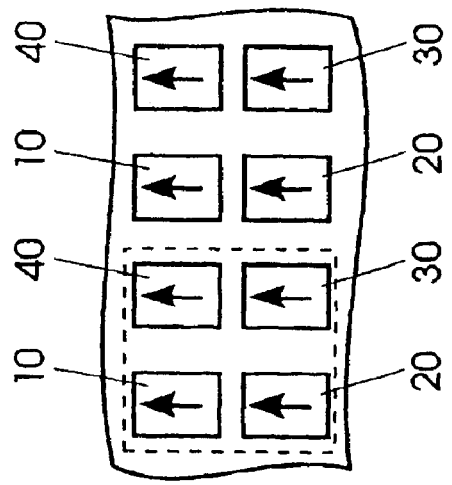

The invention will be explained in more detail by virtue of schematical embodiments. There is shown in:

FIG. 1a a Wheatstone bridge with magneto-resistive bridge elements of equal magnetization direction, FIG. 1b a Wheatstone bridge with the given magnetization direction of the bridge elements during ion implantation, FIG. 1c a Wheatstone bridge with the given magnetization direction of the bridge elements after ion implantation, FIG. 2a a section of a wafer provided with indicated surface areas of a spin-valve layer system of same magnetization direction, FIG. 2b a section of a wafer provided with covered surface areas during ion implantation, FIG. 2c a section of a wafer according to FIG. 2b provided with surface areas and the magnetization direction after ion implantation, FIGS. 3, 4 and 6 possible embodiments of the spin-valve layer system of the invention and feasible according to the same, and FIG. 5 an embodiment of an artificial anti-ferromagnet.

All the following examples initially start from a substrate S which at first is provided with a spin-valve layer system as usual. In the embodiment according to FIG. 3 a GMR spin-valve layer system is formed by an exemplary layer sequence comprised of permalloy 14, copper 13, cobalt 12, and an anti-ferromagnetic layer 11, which can consist of FeMn, NiO, PtMn, NiMn or the like. In the course of manufacturing the multilayer stack a homogeneous magnetic field is applied so that in the boundary layer between the layers 11 and 12 a uniformly oriented magnetization ml is "frozen in" (pinned). An example in accordance with FIG. 4 realizes a TMR-spin-valve layer system, in which equal layers 11, 12, 14 are provided, layer 13, however, is formed by a tunnel layer made of, for example, $Al_2O_3$. Furthermore, it lies within the scope of the invention to design the layer 12 (refer to FIG. 3) as an artificial anti-ferromagnet (AAF= artificial anti-ferromagnet), so that according to FIG. 6, an AF/AAF layer system is formed. For the sake of clarity, further usual protective layers, for example, made of Ta, which cover the layer systems mentioned as well as adherence layers, if required, which are directly deposited onto the substrate S before the layer systems mentioned are deposited, are omitted.

This is followed by a usual structuring process, in which either the individual bridge elements 1, 2, 3, 4, of the Wheatstone bridge are structurized, the bridge elements being, as rule, meander shaped (not shown in FIGS. 1a and 1b), or there are at first only pre-defined surface areas 10, 20, 30, 40 (refer to FIG. 2b) provided with a cover or a suitable masking. These surface areas as well as the recesses separating the former are provided with the final meander structure of the bridge elements in a later structuring step. In FIGS. 2a to 2c the surface areas belonging to the final Wheatstone bridge are enclosed by a dash-lined rectangle. According to a recent practical solution 80.000 of such surface areas are provided on a 6" silicon wafer so that 20.000 Wheatstone bridges covering an area of 0.5 $mm^2$ can be simultaneously produced. The wiring of the individual bridge elements can be carried out before depositing the spin-valve layer systems mentioned or in a later process step.

The widths of the single layers 11, 12, 13, 14 lie between 0.5 to 50 nm, depending on the kind of embodiment. So, for example, on a silicon wafer having a $SiO_2$-layer of a thickness of 1.5 μm and a Ta-layer of a thickness of 5 μm a typical system according to FIG. 3 can be provided with a Py-layer of a thickness of 5 nm, a Cu-layer of a thickness of 3 nm, a Co-layer of a thickness of 4 nm, a FeMn-layer (AF) of a thickness of 20 nm, and a not shown Ta-protective layer of a thickness of 5 nm. It is unnecessary here to mention further concrete thicknesses for layer systems of other systems since these belong to the state of art. At this in FIG. 1a or FIG. 2a provided initial state the present invention starts out.

Initially, in a first example, the bridge elements 2, 4 or the surface areas 20, 40, the original magnetization direction of which, designated by an arrow, shall be maintained, are provided with a cover 5. This cover consists of a structured photoresist of a thickness of from 10 nm to 6 μm, depending on the kind of ions and ion energy, in the present example 1.5 μm (refer to FIG. 1b) or of a not shown mask which is provided with ranges being transparent and nontransparent to ions or of a corresponding hole mask which in the example leaves the respective bridge elements 1, 3 or the respective surface areas 10, 30 uncovered and only covers the ranges 2, 4 or 20, 40. The special thickness of the covering layer and of the masking ranges of the hole mask, respectively, depends on the energy of the ions to be implanted, whereby the energy is preset by a concrete plant. Thus, the thicknesses mentioned can be subjected to variations, but they have to be set at least to such great a thicknesses that cannot be penetrated by ions. Then the wafers are bombarded with an ion implantation of a dosage of $10^{12}$ to $10^{16}$ atoms/cm$^2$ with an energy of 1 ... 1000 keV in an ion radiation plant, for example, with inert gas ions (He, Ne, Ar). Thereby also other doping ions generally used in semiconductor doping processes can be taken into consideration, such as, for example, Ga, P or B, but also such ions which are not usually employed. Simultaneously a homogeneous magnetic field of a strength of 0.2 T in the present example is applied across the substrate. This magnetic field deviates the magnetization direction in the pinned ferromagnetic layer 12 by 180° or orients the ferromagnetic layer 12 to be directed (refer to FIGS. 1b and 2b) with respect to its magnetization direction. The respective concrete magnetic field strength depends on the layer 11 used, and can be adapted to special conditions by professional work of someone skilled in the art. After finishing the ion bombardment, which in the present example is the case after about 50 sec., and after removing the directing permanent magnet or after switching off an electromagnet, analogously useable, the pinned magnetization direction is maintained in the imprinted position. The respective final orientations, in which respective adjacent bridge elements 1, 2 or 3, 4 of a half bridge or surface areas 10, 20 or 30, 40 have an anti-parallel magnetization to one another, are represented in FIGS. 1c and 2c by respective arrows. Thereby the bridge elements 1, 3 or 2, 4 (or the surface areas 10, 30 or 20, 40) which are not adjacent to one another, are provided below the pinned ferromagnetic layer 12 and, if required, up into the substrate S, but not within the ferromagnetic layer 12, with a doping of implantable ions I in quantities of between $10^{12}$ to $5 \cdot 10^{16}$ atoms/cm$^2$, as schematically indicated in FIGS. 3, 4, and 6.

It is also possible, but technologically somewhat more expensive and more time consuming, to use a scanned ion precision beam for ion implantation which only captures the bridge elements or the surface areas, the pinned magnetization direction ml of which shall be rotated.

All features disclosed in the specification, in the subsequent claims, and represented in the drawings can be substantial for the invention individually, but also in combination with one another.

| LIST OF REFERENCE NUMBERS | |
|---|---|
| 1, 2, 3, 4 | bridge elements of a Wheatstone bridge |
| 11, 12, 13, 14 | individual layers of a GMR- or TMR-spin-valve layer system |
| 10, 20, 30, 40 | surface areas of a GMR- or TMR-spin-valve layer system |
| 5 | cover |
| I | ions |
| m1, m2 | magnetization direction |
| S | substrate |

What is claimed is:

1. A Wheatstone bridge comprising a GMR- or a TMR-spin-valve system wherein two respective pairs of bridge elements each constitute a half-bridge adjacent the other half-bridge and the bridge elements of the adjacent half-bridges exhibit an anti-parallel magnetization, each of the bridge elements of one of the half-bridges also being non-adjacent to a respective one of the bridge elements of the other bridge element, one of the non-adjacent bridge elements of each of the half-bridges being provided beneath a pinned ferromagnetic layer thereon with a doping of implantable ions in quantities of between $1 \cdot 10^{12}$ to $5 \cdot 10^{16}$ atoms/cm$^2$.

2. The Wheatstone bridge as claimed in claim 1, wherein the ions comprise He, Ar, or Ne.

3. A method for producing a Wheatstone bridge comprising a GMR- or a TMR-spin-valve system, wherein two respective pairs of bridge elements each constitute a half-bridge adjacent the other half-bridge and the bridge elements of the adjacent half-bridges exhibit an anti-parallel magnetization, wherein a substrate is provided a1) having pre-defined surface areas out of which the individual bridge elements are structurized in a later structuring process, or a2) of which already structurized Wheatstone bridge elements are comprised and the substrate is subjected to an ion bombardment in such a manner that during the ion bombardment of the surface areas or of the bridge elements b1) respective non-adjacent surface areas or non-adjacent bridge elements of adjacent half-bridges are provided with a covering non-permeable to the ions or b2) the non-adjacent surface areas or non-adjacent bridge elements of adjacent half-bridges are subjected to a raster ion radiation which exclusively affects only the non-adjacent surface areas or non-adjacent bridge elements, and c) the ion radiation being of a low dosage and a low energy, wherein said energy is particle energies of 1 to 1000 keV and said dosage is $1 \cdot 10^{12}$ to $5 \cdot 10^{16}$ atoms/cm$^2$, such that the ions penetrate a ferromagnetic layer which is to be oriented as to its magnetization direction, all the surface areas or bridge elements are exposed to a homogeneous, targeted magnetic field which has such an orientation and strength that the magnetization direction in the ferromagnetic layer of each of the surface areas or bridge elements will be rotated by 180° or will be directed and d) after removal of the directed magnetic field only the magnetization directions of the non-adjacent surface areas or bridge elements are subjected to a 180° rotation or to an orientation.

4. The method as claimed in claim 3, wherein a magnetic field of a presettable minimum strength which effects a magnetic saturation and which affects the bridge elements or the surface areas is applied during the ion radiation.

5. The method as claimed in claim 3, wherein the ionization provides the non-adjacent bridge elements or the surface areas the magnetization direction of which has to remain unaffected with a layer of a thickness of from 10 nm to 6 μm, depending on the kind of ions and on the ion energy.

6. The method as claimed in claim 5, wherein the layer is formed by a photoresist.

7. The method as claimed in claim 3, wherein the non-adjacent bridge elements or the surface areas the magnetization direction of which has to remain unaffected are covered with a separately disposable mask during ion radiation.

* * * * *